United States Patent
Lin et al.

(10) Patent No.: US 10,424,622 B2
(45) Date of Patent: Sep. 24, 2019

(54) DISPLAY DEVICE AND METHOD FOR MAKING SAME

(71) Applicant: HON HAI PRECISION INDUSTRY CO., LTD., New Taipei (TW)

(72) Inventors: Chang-Ting Lin, New Taipei (TW); Wei-Chih Chang, New Taipei (TW); Ying-Chieh Chen, New Taipei (TW); Chung-Wen Lai, New Taipei (TW); Chun-Chieh Huang, New Taipei (TW); Wei-Li Wang, New Taipei (TW); Po-Yi Lu, New Taipei (TW); Jen-Jie Chen, New Taipei (TW); I-Wei Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/027,325

(22) Filed: Jul. 4, 2018

(65) Prior Publication Data
US 2019/0013365 A1 Jan. 10, 2019

Related U.S. Application Data

(60) Provisional application No. 62/529,002, filed on Jul. 6, 2017.

(51) Int. Cl.
| | |
|---|---|
| *H01L 27/32* | (2006.01) |
| *H01L 51/52* | (2006.01) |
| *H01L 51/00* | (2006.01) |
| *H01L 51/56* | (2006.01) |
| *H01L 51/50* | (2006.01) |
| *H01L 25/16* | (2006.01) |

(52) U.S. Cl.
CPC ........ *H01L 27/3218* (2013.01); *H01L 25/162* (2013.01); *H01L 27/3225* (2013.01); *H01L 27/3262* (2013.01); *H01L 51/0097* (2013.01); *H01L 51/502* (2013.01); *H01L 51/5036* (2013.01); *H01L 51/5206* (2013.01); *H01L 51/5221* (2013.01); *H01L 51/56* (2013.01); *G09G 2300/0452* (2013.01); *H01L 51/52* (2013.01)

(58) Field of Classification Search
CPC ............... H01L 27/3218; H01L 25/162; H01L 27/3262; H01L 27/3225; H01L 51/0097; H01L 51/5036; H01L 51/502; G09G 2300/0452
See application file for complete search history.

(56) References Cited

U.S. PATENT DOCUMENTS

2014/0110726 A1* 4/2014 Naijo ................... H01L 51/52
257/88

* cited by examiner

*Primary Examiner* — Feifei Yeung Lopez
(74) *Attorney, Agent, or Firm* — ScienBiziP, P.C.

(57) ABSTRACT

A display device comprised of OLEDs and micro LEDs which allows for blue light degradation of the OLEDs includes a first substrate and a second substrate in a double-decked configuration. First light emitting elements are located and spaced on the first substrate and second light emitting elements are located and spaced on the second substrate, the light emitting elements on the lower deck being staggered so as not to be hidden by the light emitting elements on the upper deck. The upper deck has openings (or is transparent) therein to allow egress of light from the light emitting elements of the lower deck. The display device provides a solution for uneven display cause by degradation of pixels.

15 Claims, 6 Drawing Sheets

US 10,424,622 B2

DISPLAY DEVICE AND METHOD FOR MAKING SAME

FIELD

The subject matter herein generally relates to a display panel and a method for making the display panel.

BACKGROUND

Organic light-emitting diode (OLED) has advantages of wide color range, thinness, and power efficiency. However, the blue sub-pixels in OLED may have degradation problems, which have not yet been effectively solved. The conventional processing method is to increase area of the blue sub-pixel, to ensure the display effect and prolong the life of the display device. However, in this method, the blue sub-pixels need to occupy a large area, which leads to a limit at pixel density.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1A:
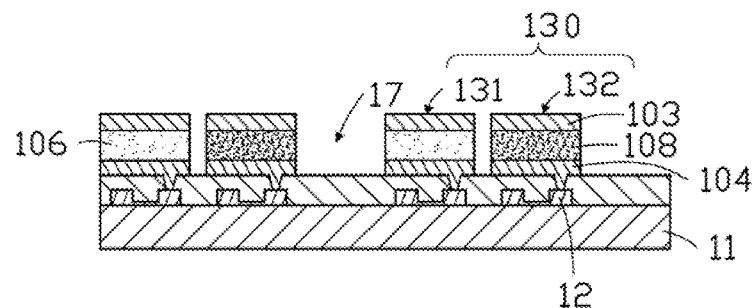
FIG. 1A through FIG. 1E are cross-sectional views showing a method for making a display according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

First Embodiment

As shown in FIG. 1A through FIG. 1E, a display device 100 comprises a plurality of organic light emitting diodes (OLEDs) and a plurality of micro light emitting diodes (micro-LEDs). The display device 100 is a hybrid display device. In this embodiment, a size of each Micro-LED is less than 50×50 μm. A method for making the display device 100 comprises the following steps.

Step 1: as shown in FIG. 1A, a first substrate 11 is provided and a plurality of first light emitting elements 106 are provided on the first substrate 11. The first light emitting elements 106 are OLEDs.

In this embodiment, each first light emitting element 106 defines a pixel, the first light emitting elements 106 define a first pixel array on the first substrate 11.

In this embodiment, the first pixel array comprises a plurality of first sub-pixels 131 and a plurality of second sub-pixels 132. The first sub-pixels 131 and the second sub-pixels 132 emit light of different colors. In this embodiment, the first sub-pixels 131 emit red light and the second sub-pixels 132 emit green light.

A plurality of first thin film transistors 12 are formed on the first substrate 11. The first thin film transistors 12 are located between the first substrate 11 and the first light emitting elements 106. The first thin film transistors 12 control the first light emitting elements 106.

In this embodiment, each first sub-pixel 131 or each second sub-pixel 132 corresponds to two first thin film transistors 12. One of the first thin film transistors 12 is directly connected to the first light emitting elements 106 and is used as a driving transistor to drive the first light emitting elements 106 to emit light. The other first thin film transistor 12 is connected to a driving transistor and is used as a switching transistor to control the driving transistor to power on and off, and is electrically coupled to a scan line (not shown) and a data line (not shown).

In other embodiments, each first sub-pixel 131 or each second sub-pixel 132 may correspond to at least two first thin film transistors 12, and each first sub-pixel 131 or each second sub-pixel 132 is controlled by the at least two first thin film transistors 12.

In this embodiment, the first substrate 11 is provided with a plurality of light transmitting regions 17 to allow light to pass through. The first thin film transistors 12 and the first light-emitting elements 106 are located in such manner as to avoid the light transmitting regions 17. The first thin film transistors 12 and the first light-emitting elements 106 thus do not block the light transmitting regions 17. In this embodiment, the first substrate 11 may be opaque and may define a plurality of openings each extending through the substrate. Each opening forms a light transmitting region 17. In other embodiments, the first substrate 11 may be transparent to allow light to pass through.

In this embodiment, each first sub-pixel 131 and adjacent second sub-pixel 132 define a group 130. A light transmitting region 17 is located between adjacent groups 130.

Each of the first light emitting elements 106 may be a conventional OLED. In this embodiment, each first light emitting element 106 includes a cathode electrode 103, an anode electrode 104, and a light emitting layer 108 sandwiched between the cathode electrode 103 and the anode electrode 104. The light emitting layer 108 is a conventional OLED light-emitting layer including an organic electroluminescent material layer (EML) (not shown). The light-emitting layer 108 may also include an electron transport layer (ETL) (not shown) and an electron injection layer (EIL) (not shown) located between the organic electroluminescent material layer and the cathode electrode 103. A hole injection layer (HIL) (not shown) and a hole transport Layer (HTL) (not shown) are also located between the organic electroluminescent material layer and the anode electrode 104.

Figure 1B:
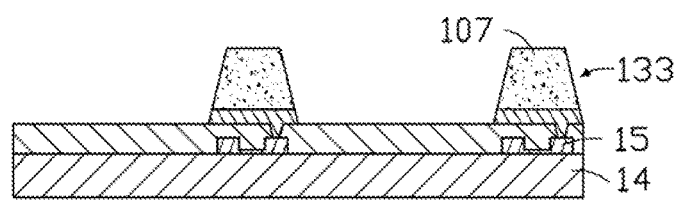

Step 2: as shown in FIG. 1B, a second substrate 14 is provided and a plurality of second light emitting elements 107 are provided on the second substrate 14. The second light emitting elements are Micro-LEDs.

In this embodiment, each second light emitting element 107 defines a pixel and the second light emitting elements 107 define a second pixel array on the second substrate 14.

In this embodiment, the second pixel array comprises a plurality of third sub-pixels 133. In this embodiment, the third sub-pixels 133 emit blue light. Micro-LEDs are used as sub-pixels emitting blue light, as a solution to the problem of the sub-pixels emitting blue light being easily degraded.

It can be understood that, in other embodiments, the first sub-pixels 131 may emit green light or blue light, the second sub-pixels 132 may emit red light or blue light, and the third sub-pixels 133 may emit red light or green light.

A plurality of second thin film transistors 15 are formed on the second substrate 14, the second thin film transistors 15 are located between the second substrate 14 and the second light emitting elements 107. The plurality of second thin film transistors 15 control the second light emitting elements 107.

In this embodiment, each third sub-pixel 133 corresponds to two second thin film transistors 15. One of the second thin film transistors 15 is directly connected to the second light emitting elements 107 and is used as a driving transistor to drive the second light emitting elements 107 to emit light. The other second thin film transistor 15 is connected to a driving transistor and is used as a switching transistor to control the driving transistor to power on and off, and is electrically coupled to a scan line (not shown) and a data line (not shown).

In other embodiments, each third sub-pixel 133 may correspond to at least two second thin film transistors 15, each third sub-pixel 133 is controlled by at least two second thin film transistors 15.

In this embodiment, the plurality of third sub-pixels 133 are spaced from each other. An area between two adjacent third sub-pixels 133 overlaps with one group 130 along a thickness direction of the display device 100. In one embodiment, the area between two adjacent third sub-pixels 133 may be smaller than an area occupied by one group 130. An area of each third sub-pixel 133 is larger than an area of the light transmitting region 17 for the sake of alignment tolerance, so that an overlapping area of the third sub-pixel 133 and the light transmitting region 17 will not be reduced through non-precise alignment.

In another embodiment, the area between two adjacent third sub-pixels 133 may be substantially the same as the area occupied by one group 130.

Each of the second light emitting elements 107 may be a Micro-LED.

In an embodiment, each second light emitting element 107 comprises a P-type doped light-emitting material layer (not shown), an N-type doped light material layer (not shown), and an active layer (not shown) between the P-type doped light-emitting material layer and the N-type doped light material layer. Each P-type doped light-emitting material layer connects to a top electrode (not shown), and each N-type doped light-emitting material layer connects to a bottom electrode (not shown). The second light emitting element 107 emits light by adjusting voltages applied to the top electrode and the bottom electrode. It can be understood that the positions of the P-type doped light emitting material layer and the N-type doped light-emitting material layer may be exchanged.

It can be understood that, in other embodiment, each of the first light emitting elements 106 can be a micro-LED, and each of the second light emitting elements 107 can be an OLED.

Figure 1C:
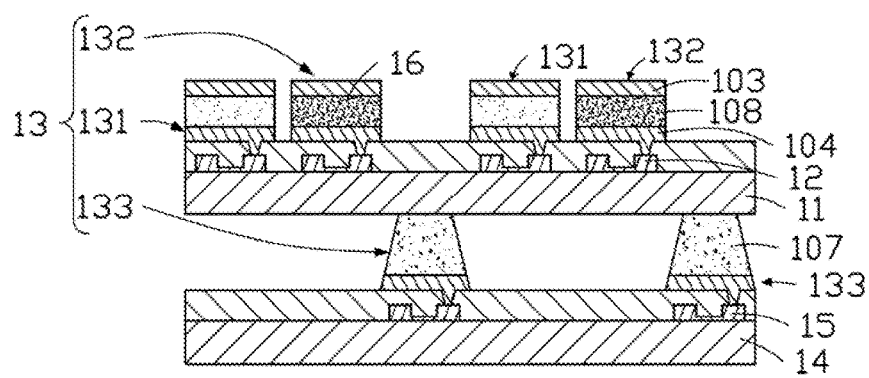

Step 3: as shown in FIG. 1C, the first substrate 11 is laminated onto the second substrate 14. The plurality of first light emitting elements 106, the first substrate 11, the plurality of second light emitting elements 107, and the second substrate 14 are sequentially stacked in a thickness direction of the display device 100. Each second light emitting element 107 is staggered from a first light emitting element 106 in the thickness direction.

In this embodiment, a projection of one second light emitting element 107 in the thickness direction at least partially overlaps with a projection of one light transmitting region 17 in the thickness direction.

In this embodiment, the first light emitting elements 106 are located on a side of the first substrate 11 away from the second substrate 14; and the second light emitting elements 107 are located on the side of the second substrate 14 adjacent to the first substrate 11.

In this embodiment, each group 130 and a third sub-pixel 133 form a pixel unit 13. That is, in this embodiment, each pixel unit 13 comprises three sub-pixels emitting red light, green light, and blue light.

Figure 1D:
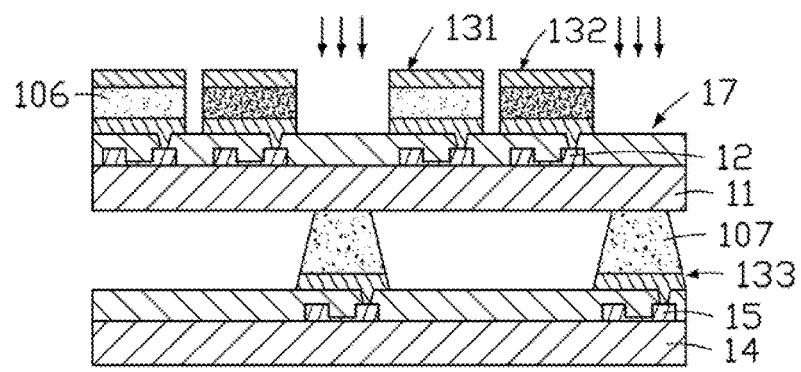
Figure 1E:
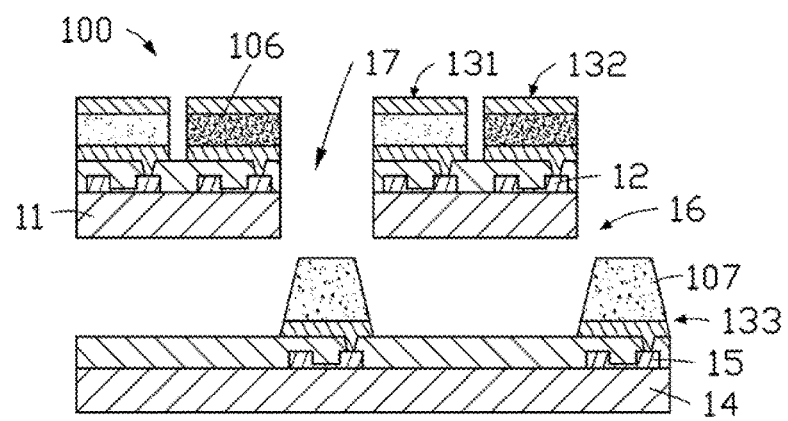

Step 4: as shown in FIGS. 1D and 1E, the first substrate 11 is etched to form a plurality of openings 16 extending through the first substrate 11. Each opening 16 forms a light transmitting region 17.

In this embodiment, the positions of the first substrate 11 corresponding to the second light-emitting elements 107 are etched to form the plurality of openings 16 extending through the first substrate 11, so that the light from the second light-emitting elements 107 can pass through the openings 16. That is, the light from the second light emitting elements 107 can pass through the light transmitting regions 17.

In this embodiment, the first substrate 11 is an opaque material. The first substrate 11 can be etched by laser to form openings 16. In other embodiment, a plasma etching may also be used. The OLED should not have contact with water vapor, thus any suitable dry etching method may be adopted.

It can be understood that, in other embodiment, the first substrate 11 may be etched to form the openings 16 extending through the first substrate 11 in the step 1, and step 4 may be omitted.

In this embodiment, the method for making the display device 100 further comprises forming a protective layer (not shown) to cover the first light emitting elements 106 and the second light emitting elements 107.

The display device 100 according to the first embodiment can be made by the above described steps. As shown in FIG. 1E, the display device 100 of the first embodiment comprises: a first substrate 11 and a second substrate 14. A plurality of first light emitting elements 106 with a space between each is on the first substrate 11 and a plurality of second light emitting elements 107 with a space between each is on the second substrate 14. The plurality of first light emitting elements 106, the first substrate 11, the plurality of second light emitting elements 107, and the second substrate 14 are sequentially stacked in the thickness direction of the display device 100. In the thickness direction, each of the second light emitting elements 107 is staggered from a first light emitting element 106. The first substrate 11 is provided with a plurality of light transmitting regions 17 to allow light output through the light transmitting regions 17. Each of the plurality of first light emitting elements 106 is an organic light emitting diode, each of the plurality of second light emitting elements 107 is a micro light emitting diode. Conversely, each of the plurality of second light emitting elements 107 can be an organic light emitting diode, and each of the plurality of first light emitting elements 106 can be an inorganic micro light emitting diode.

In this embodiment, each of the first light emitting elements 106 is an OLED, each of the second light emitting element 107 is a micro-LED. The first substrate 11 defines a plurality of openings 16 each extending through the first substrate 11. Each opening 16 forms one light transmitting region 17.

Second Embodiment

Figure 2A:
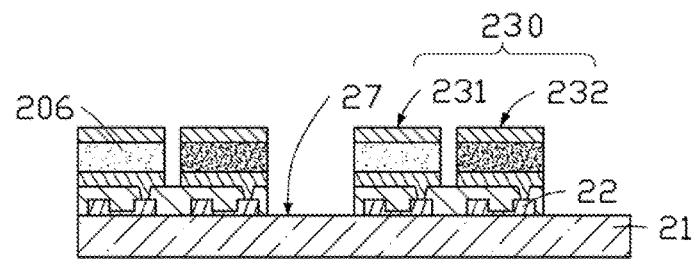
FIG. 2A through FIG. 2C are cross-sectional views showing a method for making a display according to a second embodiment of the present disclosure.
Figure 2B:
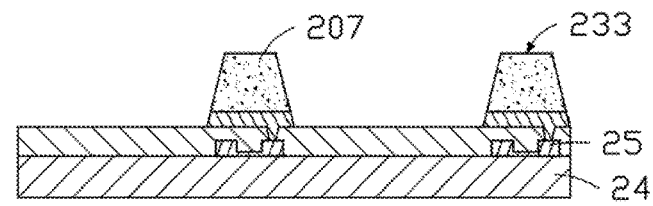
Figure 2C:
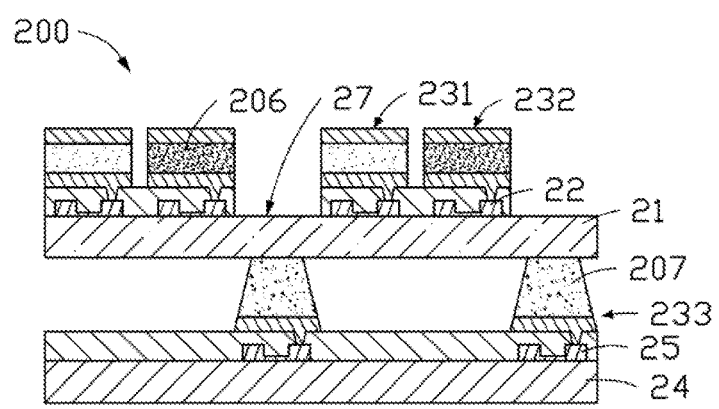

As shown in FIG. 2A through FIG. 2C, a display device 200 comprises a plurality of OLEDs and a plurality of micro-LEDs. The display device 200 is a hybrid display device. A method for making the display device 200 comprises the following steps.

Step 1: as shown in FIG. 2A, a first substrate 21 is provided, and a plurality of first light emitting elements 206 are provided on the first substrate 21. The first light emitting elements 206 are OLEDs.

In this embodiment, each first light emitting element 206 defines a pixel, and the first light emitting elements 206 define a first pixel array on the first substrate 21.

In this embodiment, the first pixel array comprises a plurality of first sub-pixels 131 and a plurality of second sub-pixels 232. The first sub-pixels 231 and the second sub-pixels 232 emit light of different colors. In this embodiment, the first sub-pixels 231 emit red light and the second sub-pixels 232 emit green light.

A plurality of first thin film transistors 22 are formed on the first substrate 21. the first thin film transistors 22 are located between the first substrate 21 and the first light emitting elements 206. The first thin film transistors 22 control the first light emitting elements 206.

In this embodiment, the first substrate 21 is a transparent substrate, and light can pass through the first substrate 21.

In this embodiment, the first substrate 21 is provided with a plurality of light transmitting regions 27 to allow light pass through. The first thin film transistors 22 and the first light-emitting elements 206 are located so as to avoid the light transmitting regions 27. The first thin film transistors 22 and the first light-emitting elements 206 thus do not block the light transmitting regions 27.

In this embodiment, each first sub-pixel 231 and one adjacent second sub-pixel 232 define a group 230. Each light transmitting region 27 is located between adjacent groups 230.

Step 2: as shown in FIG. 2B, a second substrate 24 is provided and a plurality of second light emitting elements 207 is on the second substrate 24. The second light emitting elements are micro-LEDs.

In this embodiment, each second light emitting element 207 defines a pixel, and the second light emitting elements 207 define a second pixel array on the second substrate 24. The second pixel array comprises a plurality of third sub-pixels 233, and the third sub-pixels 233 emit blue light.

A plurality of second thin film transistors 25 are formed on the second substrate 24, the second thin film transistors 25 are located between the second substrate 24 and the second light emitting elements 207. The second thin film transistors 25 control the second light emitting elements 207.

In this embodiment, the third sub-pixels 233 are spaced from each other. An area between two adjacent third sub-pixels 233 overlaps with one group 230 along a thickness direction of the display device 200. In one embodiment, the area between two adjacent third sub-pixels 233 may be smaller than an area occupied by one group 230. An area of each third sub-pixel 233 is larger than an area of the light transmitting region 27. An overlapping area of the third sub-pixel 233 and the transmitting region 17 will not be reduced though the first substrate 11 and the second substrate 14 are not aligned accurately. In other embodiments, the area between two adjacent third sub-pixels 233 may be substantially the same as the area occupied by one group 230.

It can be understood that, in other embodiments, each of the first light emitting elements 206 can be a micro-LED, and each of the second light emitting elements 207 can be an OLED.

Step 3: as shown in FIG. 2C, the first substrate 21 is laminated on the second substrate 24. The plurality of first light emitting elements 206, the first substrate 21, the plurality of second light emitting elements 207, and the second substrate 24 are sequentially stacked in a thickness direction of the display device 200. Each second light emitting element 207 is staggered from a first light emitting element 206 in the thickness direction.

In this embodiment, a projection of one second light emitting element 207 in the thickness direction at least partially overlaps with a projection of one light transmitting region 27 in the thickness direction.

In this embodiment, the first substrate 21 is transparent to allow light to pass through, and the first substrate 21 does not need to be etched. The light from the second light emitting elements 207 passes through the light transmitting regions 27.

The display device 200 of the second embodiment can be made by the above described steps. As shown in FIG. 2C, the display device 200 of the second embodiment comprises a first substrate 21 and a second substrate 24. A plurality of first light emitting elements 206 spaced apart is on the first substrate 21 and a plurality of second light emitting elements 207 spaced apart is on the second substrate 24. The plurality of first light emitting elements 206, the first substrate 21, the plurality of second light emitting elements 207, and the second substrate 24 are sequentially stacked in the thickness direction of the display device 200. In the thickness direction, the second light emitting elements 207 are staggered from a first light emitting elements 206. The first substrate 21 is provided with a plurality of light transmitting regions 27 to allow light output through the light transmitting regions 27. Each of the plurality of first light emitting elements 206 is an organic light emitting diode, each of the plurality of second light emitting elements 207 is a micro light emitting diode. Conversely, each of the plurality of second light emitting elements 207 can be an organic light emitting diode, and each of the plurality of first light emitting elements 206 can be a micro light emitting diode.

In this embodiment, each of the first light emitting elements 106 is an OLED, each of the second light emitting element 107 is a micro-LED. The first substrate 21 is transparent.

Third Embodiment

Figure 3A:
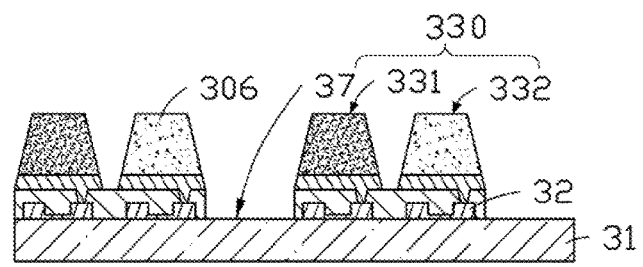
FIG. 3A through FIG. 3C are cross-sectional views showing a method for making a display according to a third embodiment of the present disclosure.
Figure 3B:
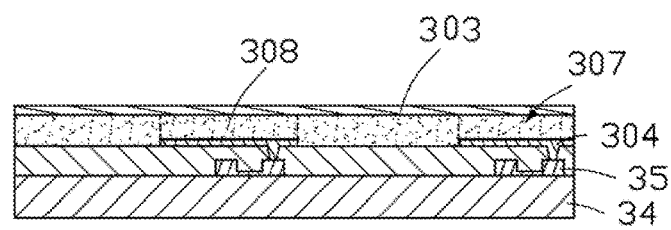
Figure 3C:
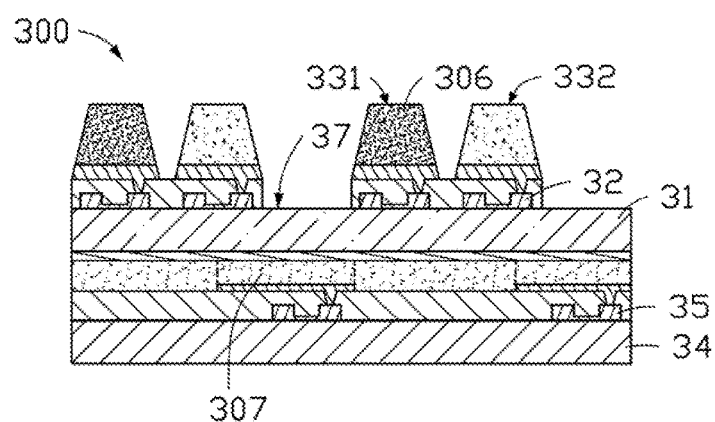

As shown in FIGS. 3A through 3C, a display device 300 comprises a plurality of OLEDs and a plurality of Micro- LEDs. The display device 300 is a hybrid display device. A method for making the display device 300 comprises the following.

Step 1: As shown in FIG. 3A, a first substrate 31 is provided, and a plurality of first light emitting elements 306 are provided on the first substrate 31. The first light emitting elements 306 are Micro-LEDs.

In this embodiment, each first light emitting element 306 defines a pixel, and the plurality of first light emitting elements 306 define a first pixel array on the first substrate 31.

In this embodiment, the first pixel array comprises a plurality of first sub-pixels 131 and a plurality of second sub-pixels 332, the first sub-pixels 331 and the second sub-pixels 332 emit light of different color. In this embodiment, the first sub-pixels 331 emit green light and the second sub-pixels 332 emit blue light.

A plurality of first thin film transistors 32 are formed on the first substrate 31. The first thin film transistors 32 are located between the first substrate 31 and the first light emitting elements 306. The first thin film transistors 32 control the first light emitting elements 306.

In this embodiment, the first substrate 31 is transparent, and light can pass through the first substrate 31.

In this embodiment, the first substrate 31 is provided with a plurality of light transmitting regions 37 to allow light to pass through. The first thin film transistors 32 and the first light-emitting elements 306 are located so as to avoid the light transmitting regions 37. The first thin film transistors 32 and the first light-emitting elements 306 thus do not block the light transmitting regions 37.

In this embodiment, each first sub-pixel 331 and an adjacent second sub-pixel 332 define a group 330, and each light transmitting region 37 is located between two adjacent groups 330.

Step 2: as shown in FIG. 3B, a second substrate 34 is provided and a plurality of second light emitting elements 307 are on the second substrate 34. The second light emitting elements are OLEDs.

In this embodiment, each second light emitting element 307 defines a pixel, the second light emitting elements 307 define a second pixel array on the second substrate 34.

In this embodiment, the second pixel array comprises a plurality of third sub-pixels 333.

A plurality of second thin film transistors 35 are formed on the second substrate 34, the second thin film transistors 35 are located between the second substrate 34 and the second light emitting elements 307. The second thin film transistors 35 control the second light emitting elements 307.

Each second light emitting element 307 includes a light emitting layer 308, a cathode electrode 303, and an anode electrode 304. The cathode electrode 303 and the anode electrode 304 are located on opposite sides of the light emitting layer 308. Two second light emitting elements 307 (or at least two) share a single light emitting layer 308. In this embodiment, all the second light emitting elements 307 share a single light emitting layer 308.

In one embodiment, at least two adjacent second light emitting elements share a single anode electrode 304. In one embodiment, at least two adjacent second light emitting elements share a single cathode electrode 303.

In this embodiment, all the second light emitting elements 307 share a single cathode electrode 303, and the anode electrodes 304 are spaced apart.

The plurality of second thin film transistors 35 only drive the portions of the single cathode electrode 303 which are overlapped with the anode electrodes 304, to emit light.

In this embodiment, the third sub-pixels 33 emit red light.

Step 3: as shown in FIG. 3C, the first substrate 31 is laminated on the second substrate 34. The first light emitting elements 306, the first substrate 31, the second light emitting elements 307, and the second substrate 34 are sequentially stacked in a thickness direction of the display device 300. Each second light emitting elements 307 is staggered from the first light emitting elements 306 in the thickness direction.

In this embodiment, a projection of one second light emitting element 307 in the thickness direction at least partially overlaps with a projection of one light transmitting region 37 in the thickness direction.

In this embodiment, the first substrate 31 is transparent to allow light to pass through, and the first substrate 31 does not need to be etched. The light from the second light emitting elements 307 passes through the light transmitting regions 37.

In one embodiment, an area between two adjacent second light emitting layers 307 may be smaller than an area occupied by one group 330, and an area of each second light emitting layer 307 is larger than an area of the light transmitting region 37. In other embodiments, the area between two adjacent second light emitting layers 307 may be substantially the same as the area occupied by one group 330.

The display device 300 of the third embodiment can be made by the above steps. As shown in FIG. 3C, the display device 300 of the third embodiment comprises: a first substrate 31 and a second substrate 34. A plurality of first light emitting elements 306 spaced apart are on the first substrate 31 and the plurality of second light emitting elements 307 spaced apart are on the second substrate 34. The plurality of first light emitting elements 306, the first substrate 31, the plurality of second light emitting elements 307, and the second substrate 34 are sequentially stacked in the thickness direction of the display device 300. In the thickness direction, the second light emitting elements 307 are staggered from the first light emitting elements 306. The first substrate 31 is provided with a plurality of light transmitting regions 37 to allow light from the second light emitting elements to pass through the light transmitting regions 37. Each first light emitting element 306 is an organic light emitting diode, and each second light emitting element 307 is a micro light emitting diodes, or the converse may be true.

In this embodiment, each of the first light emitting elements 306 is a micro-LED and each of the second light emitting elements 307 is an OLED. The first substrate 21 is transparent. Each second light emitting element 307 includes a light emitting layer 308, a cathode electrode 303, and an anode electrode 304. The cathode electrode 303 and the anode electrode 304 are located on opposite sides of the light emitting layer 308. At least two second light emitting elements 307 share a single light emitting layer 308.

In one embodiment, at least two second light emitting elements 307 share a single cathode electrode 303. In one embodiment, at least two second light emitting elements 307 share a single anode electrode 304.

Fourth Embodiment

As shown in FIG. 4A through FIG. 4F, a display device 400 comprises OLEDs and micro-LEDs. The display device 400 is a hybrid display device. A method for making the display device 400 comprises the following steps.

Figure 4A:
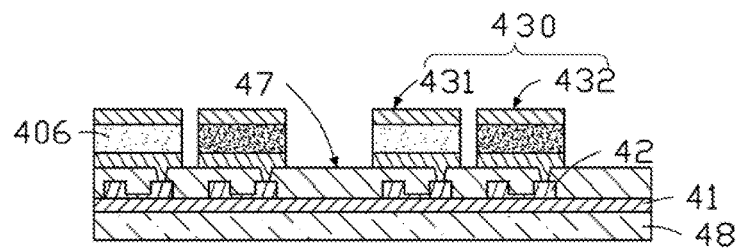
FIG. 4A through FIG. 4F are cross-sectional views showing a method for making a display according to a fourth embodiment of the present disclosure.

Step 1: as shown in FIG. 4A, a first supporting substrate 48 and a first substrate 41 are provided, the first supporting substrate 48 supports the first substrate 41. First light emitting elements 406 are provided on the first substrate 41, and the first light emitting elements 406 are OLEDs.

In this embodiment, each first light emitting element 406 defines a pixel, the first light emitting elements 406 define a first pixel array on the first substrate 41.

In this embodiment, the first pixel array comprises a plurality of first sub-pixels 431 and a plurality of second sub-pixels 432, the first sub-pixels 431 and the second sub-pixels 432 emitting light of different color. In this embodiment, the first sub-pixels 431 emit red light and the second sub-pixels 432 emit green light.

A plurality of first thin film transistors 42 are formed on the first substrate 41, the first thin film transistors 42 are located between the first substrate 11 and the first light emitting elements 406. The first thin film transistors 42 control the first light emitting elements 406.

In this embodiment, the first substrate 41 is flexible, but first supporting substrate 48 is rigid. The first supporting substrate 48 supports the first substrate 41.

In this embodiment, the first substrate 41 is provided with a plurality of light transmitting regions 47 to allow light to pass through. The first thin film transistors 42 and the first light-emitting elements 406 are located so as to avoid the light transmitting regions 47. The first thin film transistors 42 and the first light-emitting elements 406 thus do not block the light transmitting regions 47. In this embodiment, light transmittance of the first substrate 41 is not limited.

In this embodiment, each first sub-pixel 431 and an adjacent second sub-pixel 432 define a group 430, and each light transmitting region 47 is located between two adjacent groups 430.

Figure 4B:
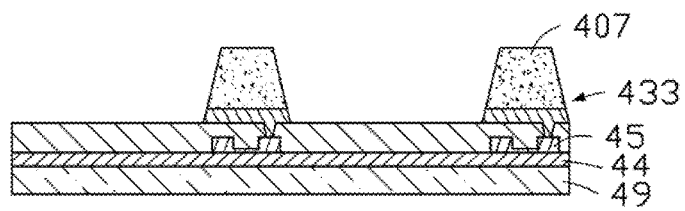

Step 2: as shown in FIG. 4B, a second supporting substrate 49 and a second substrate 44 are provided, the second supporting substrate 49 supporting the second substrate 44. Second light emitting elements 407 are provided on the second substrate 44, the second light emitting elements 407 are micro-LEDs.

In this embodiment, the second substrate 44 is flexible, but the second supporting substrate 49 is rigid, and the second supporting substrate 49 supports the second substrate 44.

In this embodiment, the first substrate 41 and the second substrate 44 are polymide films (PI film), and the first supporting substrate 48 and the second supporting substrate 49 can be made of glass.

In this embodiment, each second light emitting element 407 defines a pixel, the second light emitting elements 407 define a second pixel array on the second substrate 44.

In this embodiment, the second pixel array comprises a plurality of third sub-pixels 433, the third sub-pixels 433 emit blue light.

Second thin film transistors 45 are formed on the second substrate 44, the second thin film transistors 45 are located between the second substrate 44 and the second light emitting elements 407. The second thin film transistors 45 are used to control the second light emitting elements 407.

In this embodiment, the third sub-pixels 433 are spaced apart. An area between two adjacent third sub-pixels 433 overlaps one group 430 along a thickness direction of the display device 400. In one embodiment, the area between two adjacent third sub-pixels 433 may be smaller than an area occupied by one group 430, and an area of each third sub-pixel 433 is larger than an area of the light transmitting region 47. An overlapping area of the third sub-pixel 133 and the light transmitting region 47 will then not be reduced through misalignment of the first substrate 41 and the second substrate 44. In other embodiment, the area between two adjacent third sub-pixels 433 may be substantially the same as the area occupied by one group 430.

It can be understood that, in other embodiment, each first light emitting element 406 can be a micro-LED, and each second light emitting element 407 can be an OLED.

Figure 4C:
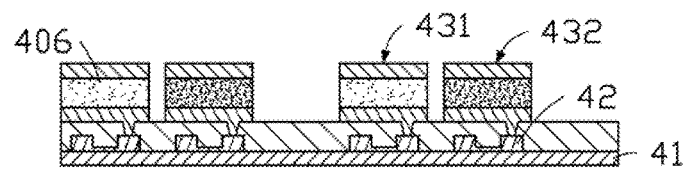

Step 3: as shown in FIG. 4C, the first supporting substrate 48 can be peeled off.

In this embodiment, a method of peeling off can be mechanical peeling off or peeling off by laser. In the laser process, laser is directed from the first supporting substrate 48 side to the interface between the first supporting substrate 48 and the first substrate 41, leaving the material at the interface in a molten state, to make the first supporting substrate 48 easier to peel.

Figure 4D:
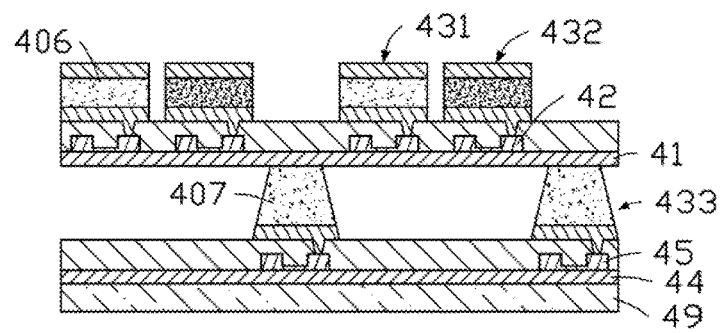

Step 4: as shown in FIG. 4D, the first substrate 41 is laminated onto the second substrate 44. The first light emitting elements 406, the first substrate 41, the second light emitting elements 407, and the second substrate 44 are sequentially stacked in the thickness direction of the display device 400. Each second light emitting element 407 is staggered from each first light emitting element 406 in the thickness direction.

In this embodiment, a projection of one second light emitting element 407 in the thickness direction at least partially overlaps with a projection of one light transmitting region 47 in the thickness direction.

Figure 4E:
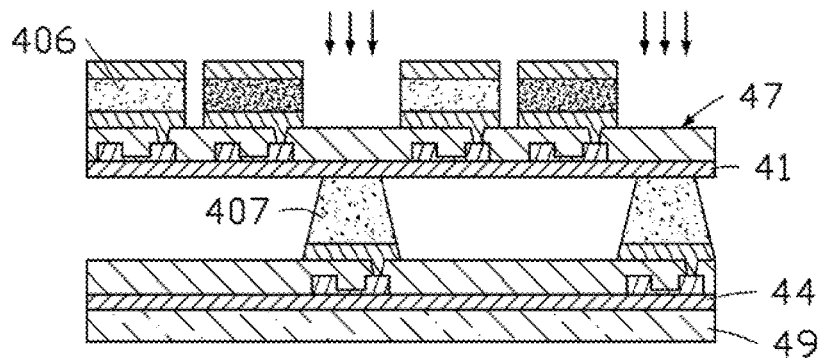

Step 5: As shown in FIG. 4E, the first substrate 41 is etched to form openings 46 each extending through the first substrate 41. Each opening 16 forms one light transmitting region 47.

In this embodiment, positions on the first substrate 41 which correspond to the second light-emitting elements 407 are etched to form the openings 46 each extending through the first substrate 41. The light from the second light-emitting elements 407 can pass through the openings 46.

Figure 4F:
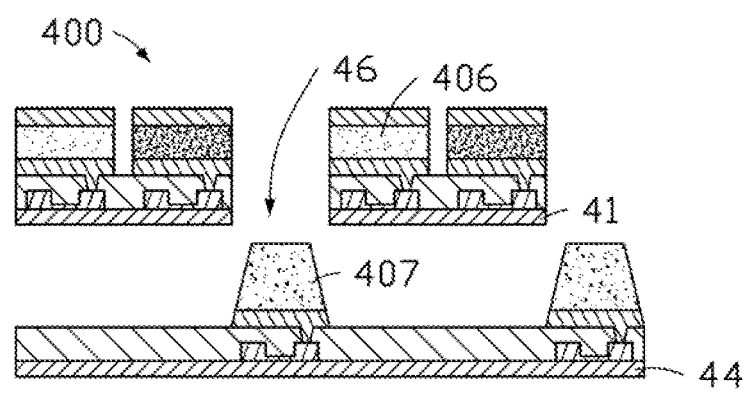

Step 5: As shown in FIG. 4F, the second supporting substrate 49 is peeled off.

In this embodiment, the flexible first substrate 41 and the flexible second substrate 44 are respectively supported by the rigid first supporting substrate 48 and the rigid second supporting substrate 49. The first supporting substrate 48 and the second supporting substrate 49 can then be removed, thereby a flexible display device 400 is made.

The display device 400 of the fourth embodiment can be made by the above described steps. As shown in FIG. 4F, the display device 400 of the fourth embodiment comprises: a first substrate 31 and a second substrate 44. First light emitting elements 406 spaced apart are on the first substrate 41 and second light emitting elements 407 spaced apart are on the second substrate 44. The plurality of first light emitting elements 406, the first substrate 41, the plurality of second light emitting elements 407, and the second substrate 44 are sequentially stacked in the thickness direction of the display device 400. In the thickness direction, the second light emitting elements 407 are staggered from the first light emitting elements 406. The first substrate 41 is provided with a plurality of light transmitting regions 47 to allow light from the second light emitting elements to pass through. Each first light emitting element 406 is an organic light emitting diode, and each second light emitting elements 407 is a micro light emitting diode, or the converse can apply.

In this embodiment, each of the first light emitting elements 406 is an OLED, each of the second light emitting elements 407 is a micro-LED. A plurality of openings 46, each of which extends through the first substrate 11, forms one light transmitting region 47. Both the first substrate 41 and the second substrate 44 are flexible.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A display device, comprising:
    a first substrate;
    a second substrate;
    a plurality of first light emitting elements on the first substrate and spaced apart from each other; and
    a plurality of second light emitting elements on the second substrate and spaced apart from each other;
    the plurality of first light emitting elements, the first substrate, the plurality of second light emitting elements, and the second substrate sequentially stacked in a thickness direction of the display device;
    each of the plurality of second light emitting elements staggered from the plurality of first light emitting elements in the thickness direction;
    the first substrate provided with a plurality of light transmitting regions to allow light from the plurality of second light emitting elements pass through;
    wherein each of the plurality of first light emitting elements is an organic light emitting diode, each of the plurality of second light emitting elements is a micro light emitting diode; or
    each of the plurality of second light emitting element is an organic light emitting diode, each of the plurality of first light emitting elements is a micro light emitting diode.

2. The display device of claim 1, wherein the substrate defines a plurality of openings each extending through the first substrate, each of the plurality of openings forms one of the plurality of light transmitting regions.

3. The display device of claim 1, wherein the first substrate is transparent to form the plurality of light transmitting regions.

4. The display device of claim 1, wherein
    each of the plurality of second light emitting element are organic light emitting diodes;
    each of the plurality second light emitting elements comprises a light emitting layer, a cathode electrode, and a anode electrode; the cathode electrode and the anode electrode are on opposite sides of the light emitting layer;
    at least two adjacent of the plurality of second light emitting elements share a single light emitting layer.

5. The display device of claim 4, wherein at least two adjacent of the plurality of second light emitting elements share a single cathode electrode.

6. The display device of claim 4, wherein at least two adjacent of the plurality of second light emitting elements share a single anode electrode.

7. The display device of claim 1, wherein the first substrate is flexible.

8. A method for making the display panel, comprising:
    providing a first substrate with a plurality of light transmitting regions;
    providing a plurality of first light emitting elements on the first substrate;
    providing a second substrate;
    providing a plurality of second light emitting elements on the second substrate;
    assembling the first substrate and the second substrate to make the plurality of first light emitting elements, the first substrate, the plurality of second light emitting elements, and the second substrate be sequentially stacked in a thickness direction of the display device;
    each of the plurality of second light emitting elements staggered from the plurality of first light emitting elements in the thickness direction; and
    wherein each of the plurality of first light emitting elements is an organic light emitting diode, each of the plurality of second light emitting elements is a micro light emitting diode; or
    each of the plurality of second light emitting element is an organic light emitting diode, each of the plurality of first light emitting elements is a micro light emitting diode.

9. The method of claim 8, wherein further comprising etching the first substrate to form a plurality of openings each extending through the first substrate, each of the plurality of openings forms one of the plurality of light transmitting regions.

10. The method of claim 8, wherein the first substrate is transparent.

11. The method of claim 8, wherein
    each of the plurality of second light emitting element are organic light emitting diodes;
    each of the plurality second light emitting elements comprises a light emitting layer, a cathode electrode, and a anode electrode; the cathode electrode and the anode electrode are on opposite sides of the light emitting layer;
    at least two adjacent of the plurality of second light emitting elements share a single light emitting layer.

12. The display device of claim 11, wherein at least two adjacent of the plurality of second light emitting elements share a single cathode electrode.

13. The display device of claim 11, wherein at least two adjacent of the plurality of second light emitting elements share a single anode electrode.

14. The method of claim 8, wherein both the first substrate and the second substrate are flexible substrates, the method further comprises:
    providing a first supporting substrate and a second supporting substrate, the first substrate supported by the first supporting substrate, and the second substrate supported by the second supporting substrate;
    before assembling the first substrate and the second substrate, peeling off the first supporting substrate from the first substrate;
    after peeling off the first supporting substrate, peeling off the second supporting substrate.

15. The method of claim 14, wherein a method of peeling off is mechanically peeling off or laser peeling off.

* * * * *